United States Patent
Meirlevede et al.

[11] Patent Number: 6,131,173
[45] Date of Patent: Oct. 10, 2000

[54] CLOCK DOMAIN TEST ISOLATION

[75] Inventors: Johan C. Meirlevede, Nijmegen; Gerardus A. A. Bos, Eindhoven; Jacobus A. M. Jacobs, Eindhoven; Guillaume E. A. Lousberg, Eindhoven, all of Netherlands

[73] Assignee: U.S. Philips Corporation, New York, N.Y.

[21] Appl. No.: 08/959,782

[22] Filed: Oct. 29, 1997

[30] Foreign Application Priority Data

Dec. 13, 1996 [EP] European Pat. Off. .............. 96203534

[51] Int. Cl.[7] .................................................. G01R 31/28
[52] U.S. Cl. ............................................................ 714/726
[58] Field of Search .................................. 714/726, 727, 714/729

[56] References Cited

U.S. PATENT DOCUMENTS 5,008,618  4/1991  Van Der Star ........................... 714/729
5,577,052  11/1996  Morris ..................................... 714/726
6,032,268  2/2000  Swoboda et al. ........................ 714/30

*Primary Examiner*—Albert De Cady
*Assistant Examiner*—Guy Lamarre
*Attorney, Agent, or Firm*—Brian J. Wieghaus

[57] ABSTRACT

The invention relates to an integrated circuit, comprising a number of independent clock domains. Seam circuits are provided in the interface signals paths between the clock domains in order to be able to isolate clock domains from each other during testing. Each seam circuit comprises a feedback loop having a multiplexer and a flip-flop feeding a first input of the multiplexer, a second input of the multiplexer being connected to the seam input, an output of the feedback loop being connected to the output; so that a first state of the multiplexer allows loading of a data bit in the feedback loop via the seam input, and a second state of the multiplexer freezes the data bit in the feedback loop.

7 Claims, 7 Drawing Sheets

CLOCK DOMAIN TEST ISOLATION

BACKGROUND OF THE INVENTION

The invention relates to an integrated circuit comprising a first and a second clock domain being respectively controlled by a first and a second clock signal, the first clock domain and the second clock domain being interconnected via a set of interface signal paths, each of which comprising a respective string of flip-flops, an initial flip-flop of the string being located in the first clock domain and a final flip-flop of the string being located in the second clock domain, the string being arranged for serially moving a data bit along its flip-flops from the first to the second clock domain under control of the first and the second clock signals. The invention also relates to a method of testing such a circuit.

A clock domain comprises a set of elements (e.g. flipflops and combinatory logic elements) and is under control of a single clock signal. A clock domain will often coincide with a core, i.e. a more or less independent functional unit. A chip design is then a combination of cores, possibly from different manufacturers. For a normal mode of the resulting integrated circuit, the precise cycle in which data is transferred from one core to another may not be critical as the design will normally allow a window of several cycles in which to capture the data. In a test mode, however, it is vital that every cycle is totally predictable. It can be imagined that it is a hard task to synchronize different cores, especially as the clock domains are at different locations on the chip, which introduces extra problems with respect to clock skew. Therefore, normally, clock domains have mutually different phases. Within a clock domain, special care is taken with regard to the distribution of the clock signal to the flipflops, so that there is minimal risk of clock skew.

The presence of interface signal paths between the first and the second clock domain poses problems when testing the circuit. While testing the second clock domain, the first clock domain will generate new data and propagate it via the interface signal paths to the second clock domain. The precise cycle in which data is transferred is unpredictable. Consequently, new data is generated in the second clock domain, interfering with the testing of the clock domains in an unpredictable manner.

The problem is of particular importance when the clock domains have a scan-based design for testability. A scan-based design is characterized in that the flip-flops of the circuit are scannable, meaning that, in addition to the set of normal data paths realizing the intended functionality of the circuit, a set of test data paths is provided, cascading the flip-flops to form scan chains. A scan chain is essentially a shift register that allows the flip-flops contained therein to be loaded and unloaded serially, in that way enabling the circuit to be tested according to the scan test principle.

The scan test principle works as follows. Firstly, the circuit is put to a scan state, during which test patterns are shifted into the scan chains. Secondly, the circuit is put to an execution state, during which the clock signals of the respective clock domains are made active for a single period, while the input signals of the circuit are held at pre-set values. Thus, response patterns are generated in the scan chains under influence of the loaded test patterns and input signals, and guided by the combinatory logic elements in the normal data paths of the circuit. Thirdly, after putting the circuit into the scan state again, the response patterns are shifted out from the scan chains for evaluation. This sequence can be repeated for a large number of test patterns and combinations of input signals. Faults result in response patterns deviating from response patterns that would result in the absence of faults.

However, the response patterns generated in the scan chains of the first clock domain can alter incoming interface signals to the second clock domain via the interface signal paths between them. Since the two clock signals will normally have mutually different phases, it is uncertain whether the flip-flops of the second clock domain react to the new or to the initial values of the outgoing interface signals, or even enter a metastability state. In this way, unpredictable response patterns are generated in the second clock domain. Moreover, the interface signal paths themselves can not be tested.

A solution to this problem is described in U.S. Pat. No. 5,008,618, owned by the assignee of the present invention. According to the known method, the clock domains are tested sequentially. The incoming interface signals to the clock domain under test will not change as only the clock signal of that clock domain is enabled while the others are disabled. A disadvantage of the prior art solution is that it requires extra circuitry in the clock lines, consequently limiting the speed of the circuit.

SUMMARY OF THE INVENTION

It is, inter alia, an object of the invention to provide a solution to the problem of how to control interface signals, without adding circuitry in the clock lines. To this end, a circuit according to the invention is characterized in that each one of the interface signal paths includes a first seam circuit comprising: a seam input; a seam output; a feedback loop having a seam multiplexer and a seam flip-flop being part of the relevant string and being part of a scan chain, the seam flip-flop feeding a first input of the multiplexer, a second input of the multiplexer representing the seam input, an output of the feedback loop representing the seam output; so that a first state of the multiplexer allows loading of a data bit into the feedback loop via the seam input, and a second state of the multiplexer freezes the data bit in the feedback loop. The seam circuits provide a controllable clock domain interface between a sending first clock domain and a receiving second clock domain. In a normal mode of the integrated circuit, the seam multiplexers are operated in the first state and each seam circuit passes on a data bit presented at its seam input to its seam output. In this way, the clock domain interface is transparent for interface signals going from the first to the second clock domain, and the added seam circuits only cause some additional delay in the respective interface signal paths. In a test mode of the integrated circuit, the seam multiplexers in the second state enable the seam circuits to reliably control the outgoing interface signals. During an execution state of the circuit, a data bit, inserted in the feedback loop through the scan chain during a preceding scan state, is invariably presented at the seam output, irrespective of new signals applied to the seam input. Consequently, with the aid of such seam circuits, the clock domain interface between the first and the second clock domain can be frozen in a certain state, as seen from the second clock domain, that state being configurable via loading of appropriate test patterns through the scan chains and that state being unalterable by the first clock signal.

Interface signal paths transferring data bits from the second clock domain to the first clock domain can be provided with seam circuits in the same manner as described above. Similarly, when there are further clock domains, interface signal paths between any two clock domains can be provided with seam circuits. In principle, if all interface signal paths are provided with seam circuits, all clock domains can be predictably controlled during test. The seam circuits not only allow sequential testing of the clock domains but also parallel testing.

The invention also provides observability of the outgoing interface signals from the first clock domain. In a test mode of the circuit, a data bit applied to the seam input of a seam circuit in the first state appears at its seam output, while a sample of the signal at the seam output is stored in the seam flip-flop. With respect to this storage operation, there is minimal risk of clock skew, since the seam circuits are driven by the same clock signal as the first clock domain. Therefore, the interface signal can be reliably observed. The scan chain of which the seam flip-flop is an element, is used to read out the stored sample in the seam flip-flop.

The invention also has the advantage that it allows for explicit testing of the interface signal paths. An interface signal path is tested by controlling it with the first seam circuit and observing it with the second seam circuit. A further advantage of the invention is that it allows clock domains to be tested in a stand-alone fashion. The second clock domain can control its inputs independently, i.e. it does not require special patterns to be loaded in the seam flip-flops under control of the first clock domain.

A first type of seam circuit according to the invention is further characterized in that the output of the feedback loop is constituted by the output of the seam multiplexer. This particular type of seam circuit introduces a delay in the interface signal path that only comprises the delay of the multiplexer. Advantageously, this seam circuit is inserted in a subpath shared with other interface signal paths originating from the same clock domain. If a number of interface signals from the first clock domain are fed to a set of inter-domain combinatory logic elements having a single output which is connected to the input of a flip-flop in the second clock domain, whereas the interface signals are not further required by the second clock domain, the seam circuit should be inserted at the output of the set of combinatory logic elements instead of one in each of its fifteen inputs. In this way, the area required for the seam circuits is minimized. A further advantage of this type of seam circuit is that no special precautions are required during the design of the individual clock domains and that insertion can be done straightforwardly when all clock domains are put together.

A second type of seam circuit according to the invention is characterized in that the output of the feedback loop is constituted by the output of the seam flip-flop. If the seam flip-flop is chosen to be the initial flip-flop of the relevant string, the seam circuit adds only a multiplexer to the design of the chip, which causes only small overhead in chip surface area. This type of seam circuit passes on a signal received at its seam input to its seam output under control of the relevant clock signal. Therefore, insertion of this seam circuit is particularly advantageous for subpaths carrying signals under control of that clock signal exclusively.

According to a further embodiment of the invention, the seam multiplexers are controlled by respective direction control signals having a first and a second value, corresponding to the first and the second state of the corresponding seam multiplexer, respectively, the direction control signals being generated from respective scannable direction control flip-flops. In this way, the selection between the different seam circuit states can be accomplished by providing the circuit with appropriate test patterns. One direction control signal per clock domain is usually sufficient, only requiring one flip-flop of overhead per clock domain.

The invention also has the advantage that the calculation of test patterns for a circuit according to the invention can be done automatically by an automatic test pattern generator (ATPG). The ATPG will generate test patterns forcing the seam circuits in the first state to test the interface signal path up to the respective seam output, and other test patterns forcing the seam circuits into the second state to test the remaining part of the interface signal path.

The invention is further explained below by way of example, with reference to the accompanying drawing.

DETAILED DESCRIPTION OF THE PREFERRED EMBODIMENTS

Figure 1:
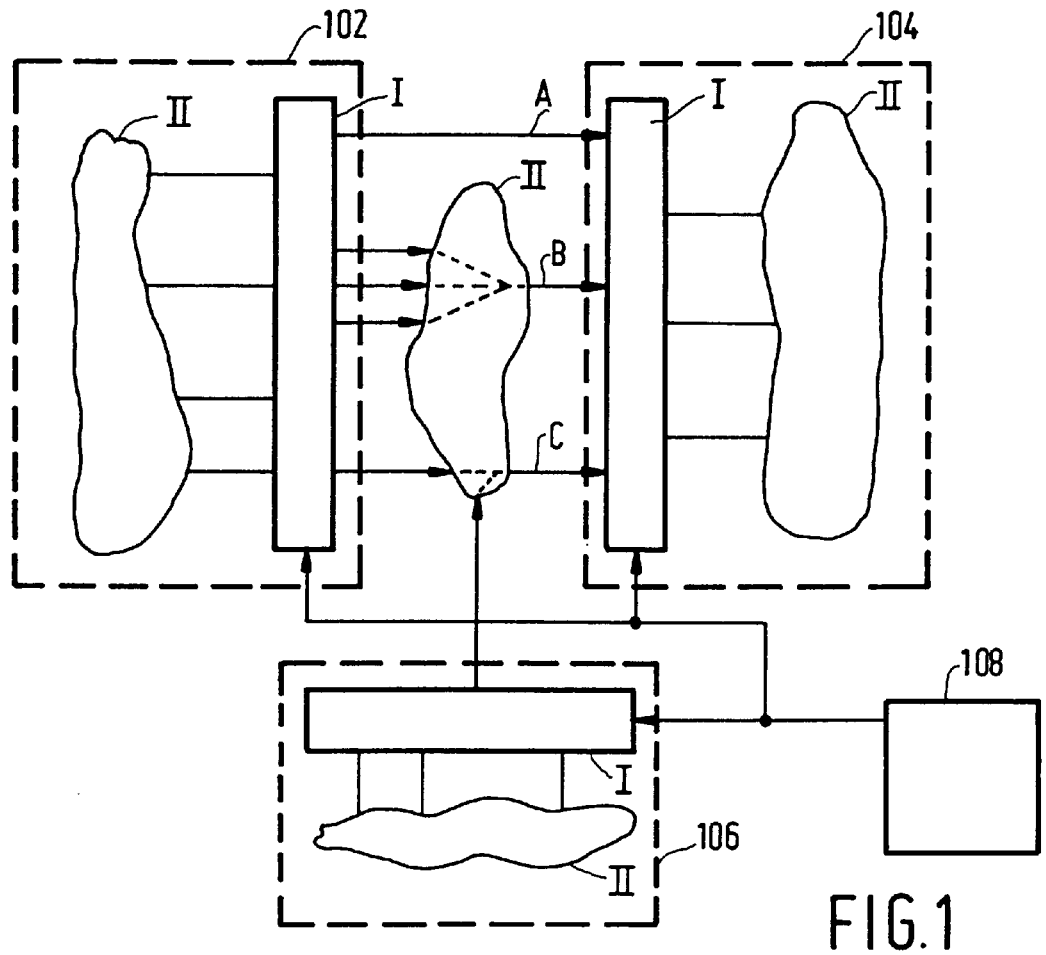
FIG. 1 shows a part of an integrated digital circuit comprising multiple clock domains and the various types of interface signals that provide communication between the clock domains.

FIG. 1 shows a part of an integrated digital circuit comprising multiple clock domains, three of which are drawn, and the various types of interface signals that provide communication between them. In a first clock domain 102, a set of flip-flops are contained in I and a set of combinatory logic elements are contained in II. Some arbitrary function is realized by their mutual interconnections, also designated the normal data path. The same applies to a second and a third clock domain, 104 and 106, respectively. The clock domains are controlled by respective clock signals that, although possibly of the same frequency, are not synchronized such that clock skew problems are precluded. The presence of the third clock domain is not essential to the principle of the invention but it facilitates the explanation. We further assume that the clock domains have a scan-based design for testability. Hereto, the flip-flops in the respective clock domains form respective scan chains via a test data path. Other clock domain test approaches, however, could be used. Whatever approach is used, the problem of the interface signal paths has to be solved.

A distinction has been made between intra-domain combinatory logic elements connecting flip-flops of one and the same clock domain, and inter-domain combinatory logic elements connecting flip-flops in different clock domains. They are drawn inside and between the clock domains, respectively.

Three possible types of interface signal paths are included in FIG. 1. An interface signal path of type A is characterized in that it comprises: an initial flip-flop in a first clock domain; a final flip-flop in a second clock domain; a connection between the initial and the final flip-flop not passing through inter-domain combinatory logic elements. Three interface signal paths of type B are drawn. An interface signal path of type B is characterized in that it comprises: an initial flip-flop in a first clock domain; a final flipflop in a second clock domain; an interconnection between these two flip-flops that passes through one or more inter-domain combinatory logic elements, thereby subdividing the interface signal path into a number of subpaths. For example, the three interface signal paths of type B shown in FIG. 1 have their own separate initial flip-flops in the first clock domain 102, the outputs of which are combined by, say, a NAND-gate in the inter-domain combinatory logic. The output of the NAND gate is connected via a subpath, shared among the three interface signal paths, to the input of a shared receiving flip-flop in the second clock domain 104. An interface signal path of type C comprises: an initial flip-flop in a first clock domain; a final flip-flop in a second clock domain; an interconnection between these flip-flops comprising further inter-domain combinatory logic elements that involve signals from other clock domains than the first. In FIG. 1, the interface signal paths of type C, one of which originating in the first clock domain 102 and another originating in the third clock domain 106, share a subpath from the inter-domain combinatory logic elements to the, shared, final flip-flop in the second clock domain 104. FIG. 1 also comprises a global test control block 108 that controls whether the integrated circuit is in an execution state or in a scan state, by providing a test signal to each scannable flip-flop, with which either the normal or the test data paths are selected.

According to the prior art solution, the clock domains are scan-tested sequentially. Firstly, during a scan state, test patterns are shifted into the scan chains. Assuming that clock domain 104 is to be tested, after putting the circuit in an execution state, the clock signal feeding clock domain 104 is made active and flip-flops in that domain will store a response pattern. If, however, at the same time the clock signal feeding clock domain 102 would be made active, flipflops in that domain would take on new values as well. Then, in most cases, the signals carried by the interface signal paths to clock domain 104 would also change. Therefore, the prior art solution prescribes that, when one clock domain is tested, only the clock signal feeding that domain is allowed to be made active. Then, all the incoming interface signals to that domain are stable. Finally, the response pattern can be shifted out during a scan state, while at the same time the initial test patterns are restored or new test patterns are loaded. The procedure is then repeated for other clock domains and other test patterns.

A problem with this procedure is that, in order to be able to disable the clock signals individually, extra hardware is required in the clock lines. The present invention solves this problem by including a seam circuit in each interface signal path. Depending on the particular type of interface signal paths A, B or C, the total overhead introduced by the inserted seam circuits can be minimized.

Figure 2:
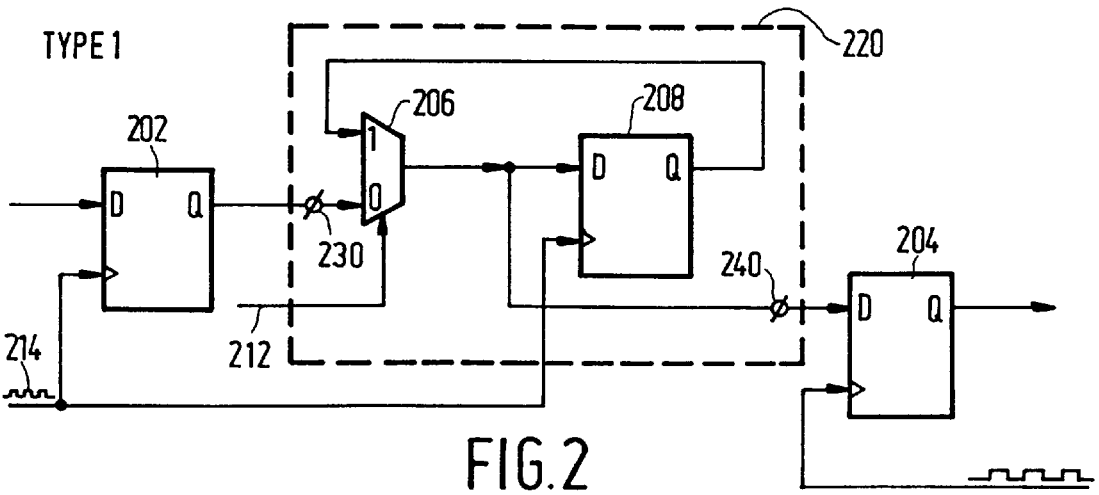
FIG. 2 shows an interface signal path, with a first type seam circuit inserted therein, FIG. 3 gives an interface signal path comprising a first implementation of a second type seam circuit, FIG. 4 gives an interface signal path comprising a second implementation of the second type seam circuit.

FIG. 2 gives an interface signal path, in which a first type seam circuit 220 is inserted in order to obtain observability and controllability of the corresponding interface signal. It shows an initial flip-flop 202, being part of a first clock domain, a final flip-flop 204 being part of a second clock domain and a first type seam circuit 220 that is inserted in the interface signal path between the flip-flops 202 and 204. Inter-domain combinatory logic elements, as present, by definition, in paths of type B and C, are left out for the moment. It is silently understood that all the flipflops shown in the figures are scannable or, in other words, take part in a scan chain, although the means necessary therefore (e.g. a multiplexer) are not explicitly drawn. The seam circuit 220 comprises a seam multiplexer 206, that is controlled by a direction control signal 212, a seam flip-flop 208 being under control of the clock signal 214 of the first clock domain, a seam input 230 and a seam output 240. The seam circuit 220 has a first and a second state, corresponding to the first and the second state of the seam multiplexer 206, respectively. In the first state, the seam multiplexer 206 will pass on a signal it receives on the seam input 230 from the initial flip-flop 202 to the seam output 240. Moreover, a sample of that signal is stored in the seam flip-flop 208.

During a normal mode of the integrated circuit, the seam circuit 220 is operated in the first state. The stored copy of the interface signal in the seam flip-flop 208 then, is not utilized. In the second state, the seam multiplexer 206 will feed the seam flip-flop 208 with the latter's output signal, in other words, the seam output 240 is held at a value that was loaded into the seam flip-flop 208 beforehand.

How seam circuit 220 achieves the objectives of the invention, is explained in the following. When the integrated circuit is in a test mode, both states of the seam circuit 220 can and should be used. In the first state, the seam circuit 220 stores a sample of the signal at the seam output 240 in the seam flip-flop 208. In a scan state of the integrated circuit, this value can be shifted out, along with the values stored in the other flip-flops of the scan chain. Thus, observability of the outgoing interface signal is obtained. In the second state, the seam circuit 220 drives the seam output 240 with the signal value shifted in the seam flip-flop 208 in the preceding scan state of the circuit, while at the same time, the seam circuit 220 is ignorant about changes at the seam input 230 provoked by the clock signal of the first domain. In this way, the incoming signal received by the second clock domain is controlled.

Figure 3:
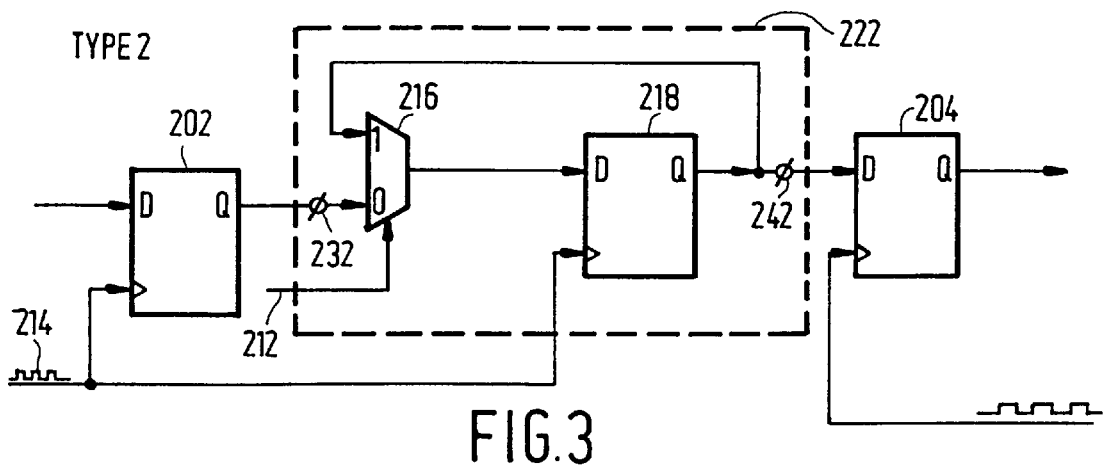

FIG. 3 gives an interface signal path comprising a first implementation of a second type seam circuit 222 comprising a seam multiplexer 216, a seam flip-flop 218, a seam input 232 and a seam output 242. The second type seam circuit 222 varies from the first type seam circuit 220 in that seam output 242 is connected to the output of the seam flip-flop 218 instead of to the output of the seam multiplexer 216. The operation of the second type seam circuit 222 is analogous to the operation of the first type seam circuit 220. The fact that in this implementation of the second type seam circuit 222 the interface signal passes through a further flip-flop can be advantageous in some cases.

Figure 4:
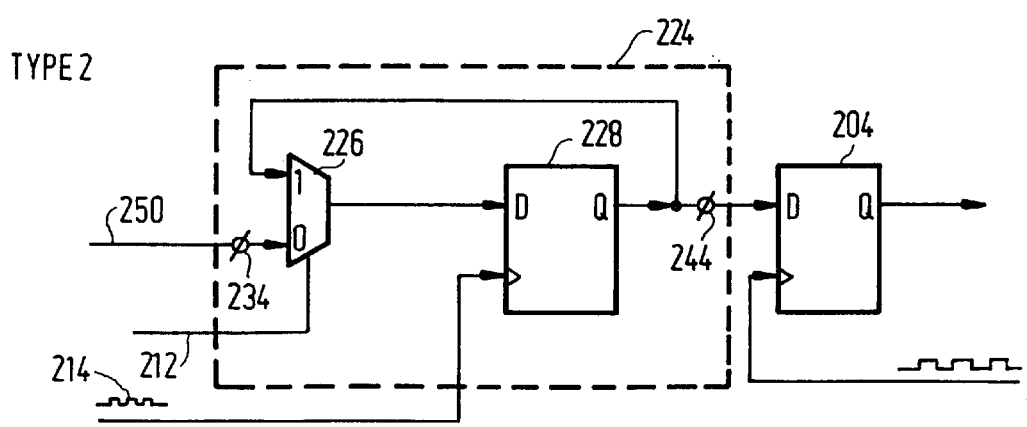

FIG. 4 gives an interface signal path that includes a second implementation of the second type seam circuit 224 comprising a seam multiplexer 226, a seam flip-flop 228, a seam input 234 and a seam output 244, distinguishing itself from the first implementation of the second type seam circuit 222 in that seam flip-flop 228 also performs the function of the initial flip-flop that has thus been incorporated into the seam circuit 224. The interface signal path enters seam circuit 224 through connection 250. An advantage of the second implementation of the second type seam circuit 224 compared to the first implementation of the second type 222 and the first type seam circuit 220 is that less chip area overhead is needed. This is particularly advantageous in case of a type A interface signal path, since the seam circuit required for that type of interface signal paths can not be shared with other interface signal paths. When this seam circuit is to be used, the initial flip-flop 228 has to be located, a multiplexer 226 has to be inserted in front of it and the connections according to FIG. 4 have to be put in place.

Figure 5:
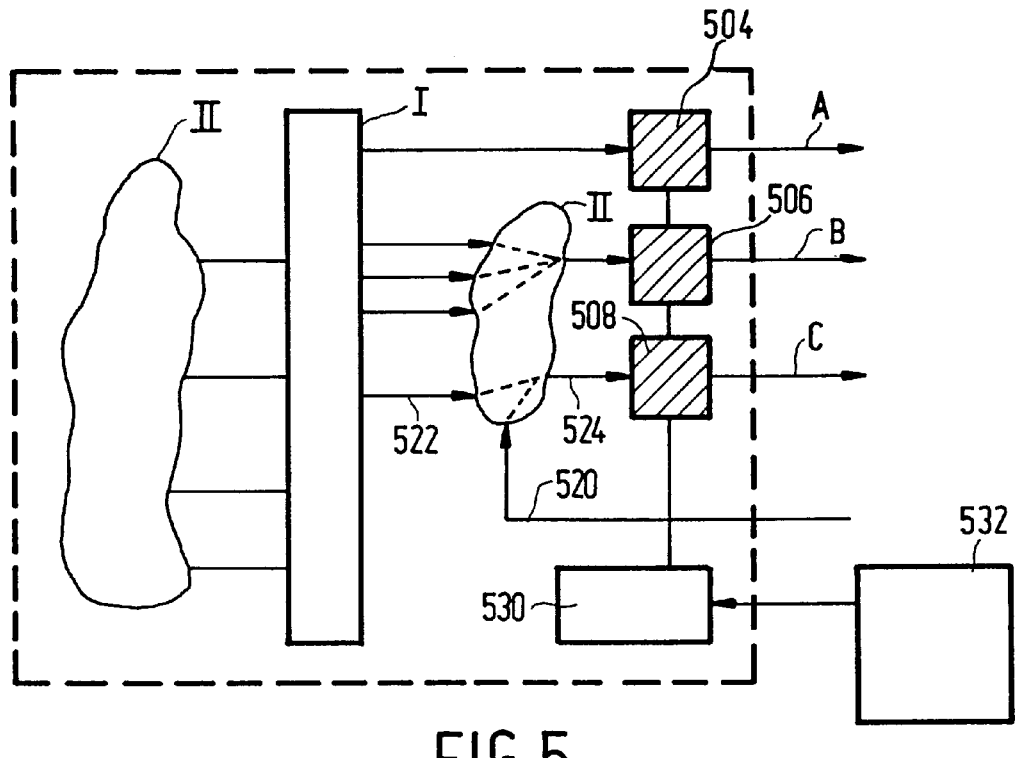
FIG. 5 illustrates how the first and second type seam circuits can be included in the circuit of FIG. 1, according to a first embodiment of the invention.

FIG. 5 illustrates how the seam circuits can be included in the circuit of FIG. 1, according to a first embodiment of the invention. Only the elements belonging to the first clock domain of FIG. 1 are drawn. Each one of the hashed squares 504, 506, 508 is either a first type seam circuit or a first implementation of the second type seam circuit. Advantageously, these two versions of seam circuits are inserted in the interface signal paths in the way indicated in FIG. 5, i.e. after any possible inter-domain combinatory logic elements. Then the number of seam circuits required can be kept within bounds, since several interface signal paths can make use of one and the same seam circuit. This is true in particular for interface signal paths of type B, whereas for interface signal paths of type A there is no resource-sharing possible with these seam circuits.

The situation is more complex for interface signal paths of type C. Two interface signal paths of type C are included in FIG. 5, a first one originating in the first clock domain and comprising subpath 522, a second one originating in an other clock domain, say the second clock domain, and comprising subpath 520. These interface signal paths have subpath 524 and seam circuit 508 in common. Due to the fact that the interface signal paths originate in different clock domains, seam circuit 508 can not reliably store a signal received at its seam input unless non-shared subpath 520 comprises a second seam circuit under control of the second clock domain. Then, when the second seam circuit is in the second state, the signal received by seam circuit 508 is controlled by same clock signal as seam circuit 508 itself, and thus can reliably be stored. The general rule is that each interface signal path, regardless its type, should pass through a sequence of one or more consecutive seam circuits, the first one of which being under control of the clock signal controlling the clock domain from which the interface signal path originates.

Direction control circuit 530 provides direction control signals to the seam circuits for selecting the state of the seam multiplexers. One such circuit per clock domain, generating one direction control signal that is fed in parallel to the seam circuits of that clock domain, is generally sufficient. The operation of the direction control circuits is controlled by a global test control block 532.

Figure 6:
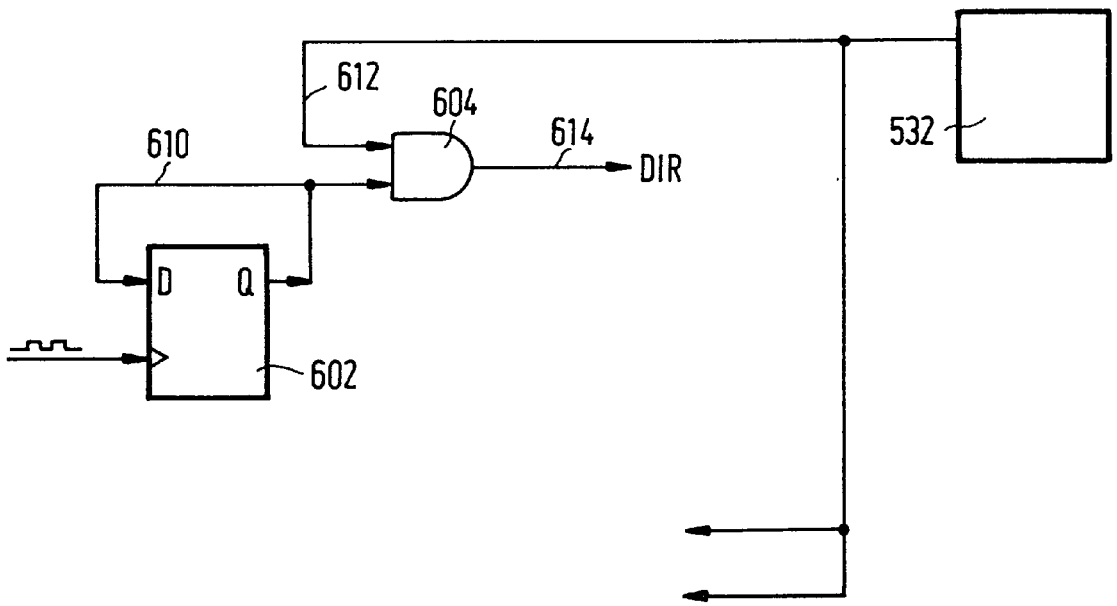
FIG. 6 shows a diagram of a direction control circuit as used in FIG. 5.

FIG. 6 illustrates a preferred implementation of such a direction control circuit. It generates a direction control signal DIR that is provided to corresponding seam circuits via connection 614. AND-gate 604 receives a test signal via connection 612 from global test control block 532. When the test signal has the value 0, the direction control signal has value 0, and, consequently, all seam multiplexers controlled by this direction control signal operate in, say, the first state. When the test signal has the value 1, the value that is stored in feedback loop 610 determines the value of the direction control signal. Scannable flip-flop 602 allows loading a value into feedback loop 610. Hereto, during a scan state of the integrated circuit, a value is shifted into scannable flipflop 602 via a scan chain. In this way, the states of the seam circuits of the integrated circuit can be controlled through appropriate test patterns. Feedback loop 610 guarantees a stable output of the flip-flop 602 during a subsequent execution state. If all direction control signals of the integrated circuit are generated accordingly, a single test signal can put the integrated circuit to normal mode operation.

Figure 7:
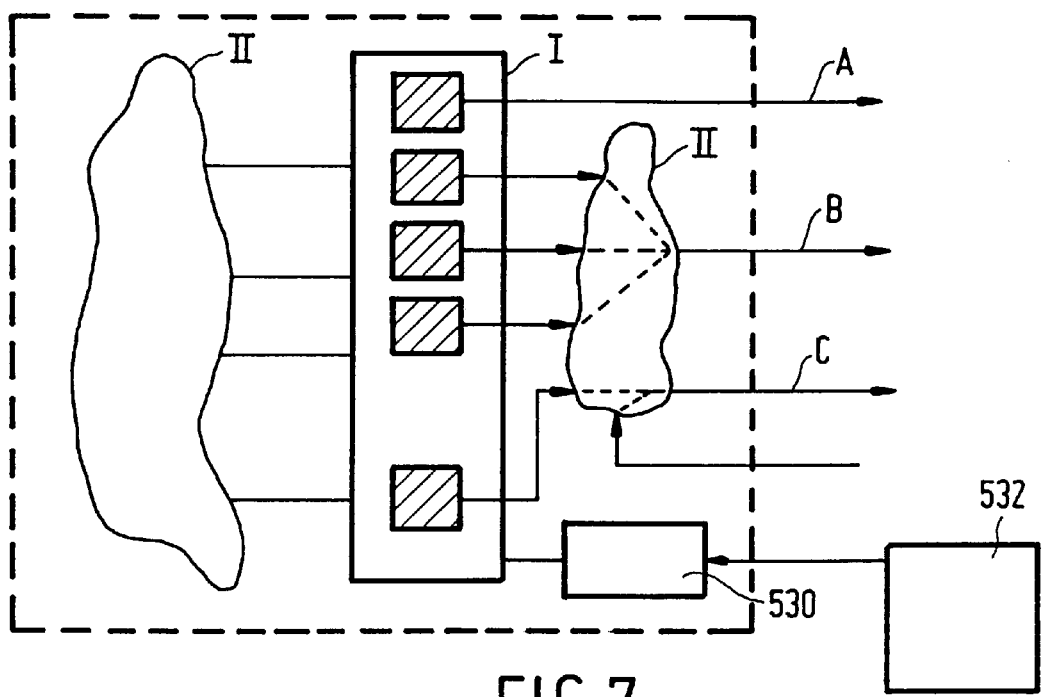
FIG. 7 illustrates how the variation of the second type seam circuit can be included in the circuit of FIG. 1, according to a second embodiment of the invention, FIG. 8 gives a third embodiment of the invention, according to which all three types of seam circuits can be incorporated in the circuit of FIG. 1.

FIG. 7 illustrates how the second implementation of the second type seam circuit can be included in the circuit of FIG. 1, according to a second embodiment of the invention. All initial flip-flops of the first clock domain are replaced by seam circuits, indicated by the hashed squares, according to the second implementation of the second type seam circuit. To stress the fact that in the second implementation of the second type seam circuit the seam flip-flop and the initial flip-flop are one and the same, the seam circuits are drawn inside I. It is clear that these seam circuits are never shared among interface signal paths. Furthermore, it can be seen that, compared to the embodiment of FIG. 5, it requires two extra seam circuits, but as the second implementation of the second type seam circuit itself only adds a multiplexer to the design, the total chip area overhead can be smaller.

Figure 8:
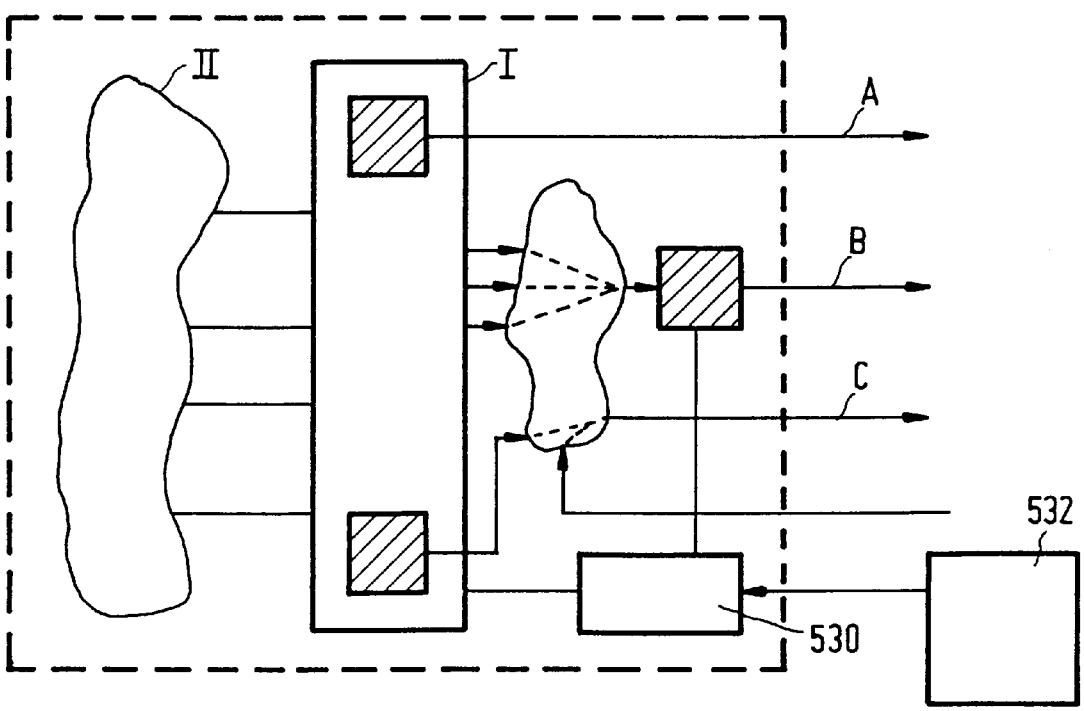

FIG. 8 gives a third embodiment of the invention, which demonstrates how all versions of seam circuits, indicated by the hashed squares, can be incorporated in the circuit of FIG. 1. As has been suggested before, in the light of overhead minimization of chip area, it is advantageous to identify nodes being shared among a large number of interface signal paths originating in one and the same domain. At such a node, a first type seam circuit or a first implementation of the second type seam circuit is appropriate. When such a node can not be found for a particular interface signal path, the second implementation of the second type seam circuit will be suited best. Also when a node is shared among a small number of interface signal paths only, this seam circuit will generally lead to lower chip area overhead than when only one seam circuit of one of the other versions is inserted. In FIG. 8 this "breakpoint" has been taken to be three.

Figure 9:
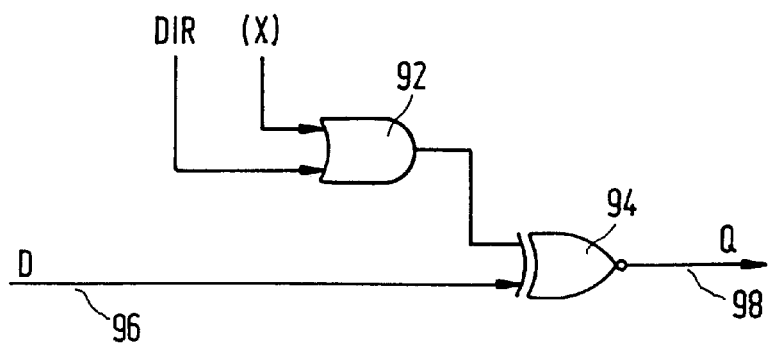
FIG. 9 shows a preferred embodiment of a validation circuit according to the invention.

FIG. 9 shows a preferred implementation of a validation circuit. Such a circuit should be inserted in the network description of the circuit at each seam output, in order to make explicit for an ATPG whether the signal at the seam output is reliable or not, from a test point of view. It comprises an OR-gate 92 and a NXOR-gate 94. The direction control signal DIR, that is fed to the corresponding seam circuit as well to select its state, forces the output 98 of the validation circuit into an unknown (X) state when the corresponding seam circuit is in the first state and passes on the signal at the seam output, received on the input 96 of the validation circuit, when the seam circuit is in the second state. This dummy circuit is only inserted in the network description of the circuit for calculating the test patterns; it is not found in the actual circuit itself.

In FIGS. 5, 7 and 8 seam circuits are inserted in the sending clock domain. This means that they are controlled by the clock signal of that domain. In an analogous manner, the seam circuits can be inserted in the receiving clock domain. Hereto, the seam flip-flops of FIGS. 2–4 would be controlled by the clock signal of the receiving clock domain. Alternatively, seam circuits can be inserted at both sides of an interface signal path, a first one under control of the sending clock domain, a second one under control of the receiving clock domain.

Figure 10:
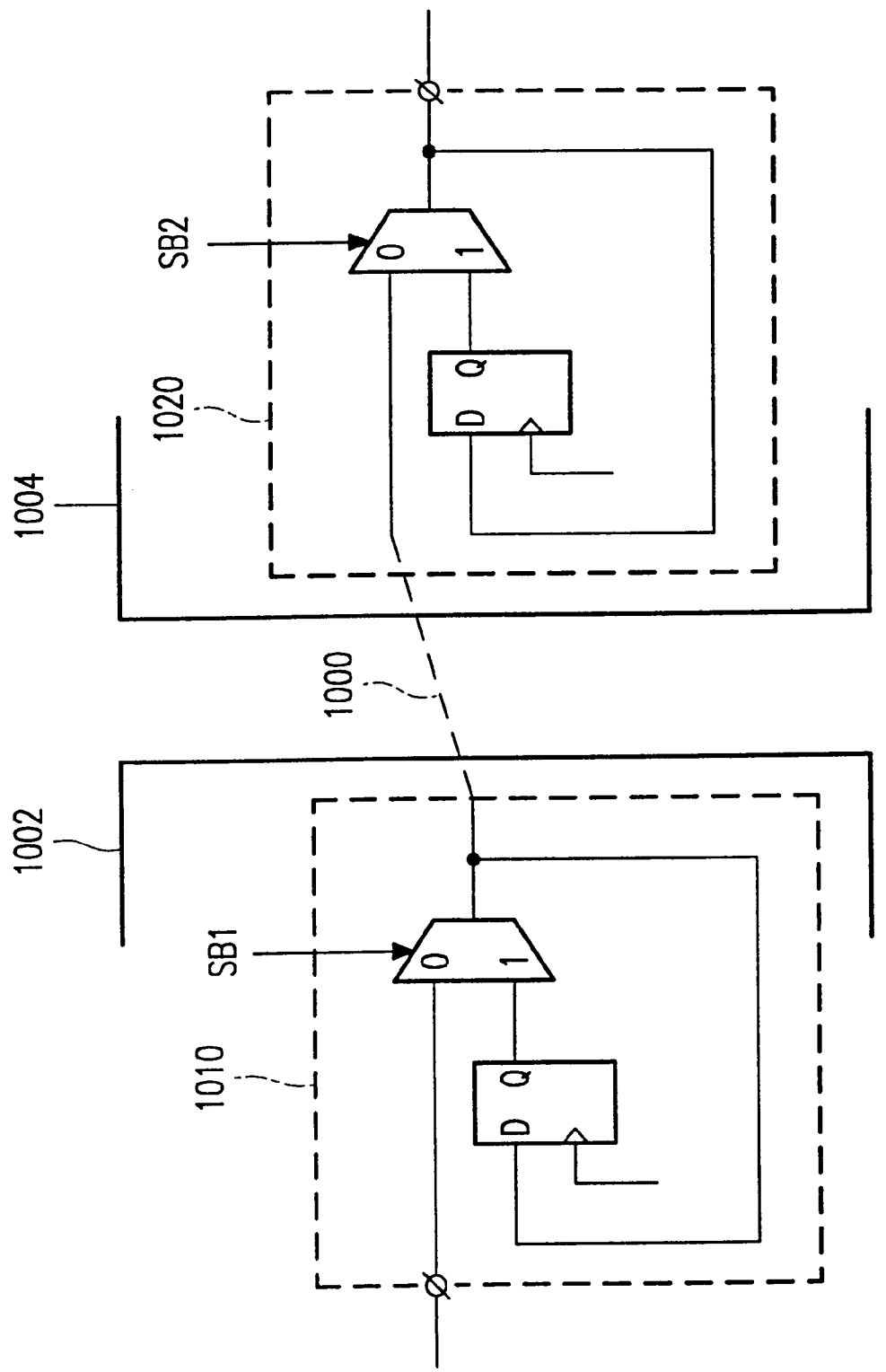
FIG. 10 illustrates an example of a signal path between a first clock domain and a second clock domain via two seam circuits in accordance with this invention.

FIG. 10 shows an example of a signal path 1000 between the first clock domain 1002 and the second clock domain 1004 that comprises two seam circuits 1010, 1020. The different modes are set by the signals SB1 and SB2 according to the following table (. signifies don't care).

TABLE 1

Modes relating to FIG. 10.

| SB1 | SB2 | |
|---|---|---|
| 0 | 0 | Normal Mode |
| . | 1 | Test Mode I |
| 1 | 0 | Test Mode II |

In Test Mode I the clock domains are separated from each other and can be tested independently. An advantage compared to the single seam circuit situation is that the second clock domain can control its inputs independently, i.e. it does not require special patterns to be loaded in the seam flip-flops under control of the first clock domain. In Test Mode II the interface signal path can be explicitly tested. Hereto, in seam circuit 1010 a test data bit is inserted and made available at the interface signal path 1000. Subsequently, seam circuit 1020 observes the interface signal path 1000 and stores a response data bit which can be checked via the appropriate scan chain. Advantageously, the signals SB1 and SB2 are generated with a control circuit comprising flip-flops and combinatory logic such that, in test mode, are well-defined.

Figure 11:
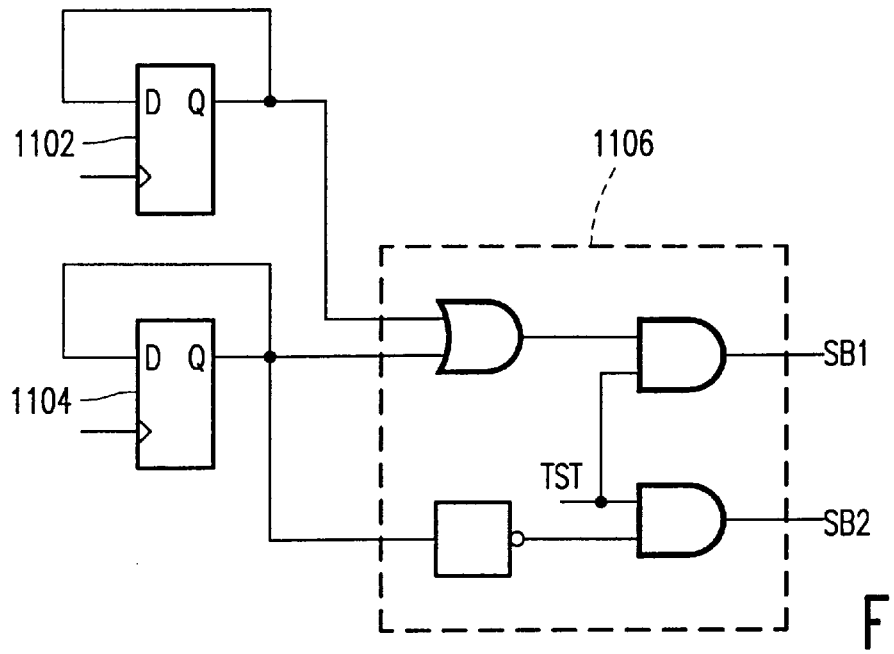
FIG. 11 illustrates a control circuit for controlling seam circuits in accordance with this invention.

FIG. 11 shows an example of such a control circuit comprising flip-flops 1102 and 1104 and combinatory logic 1106. The control circuit in a test mode (when TST is high) precludes that the interface signal path carries unreliable signals, irrespective the values that are stored in flip-flops 1102 and 1104. Therefore, when two seam circuits, like in FIG. 10, are used in combination with this control circuit, the validation circuit of FIG. 9 is not needed for the calculation of test patterns, as in test mode the seam circuits are always such that clock skew problems are prevented.

Figure 12:
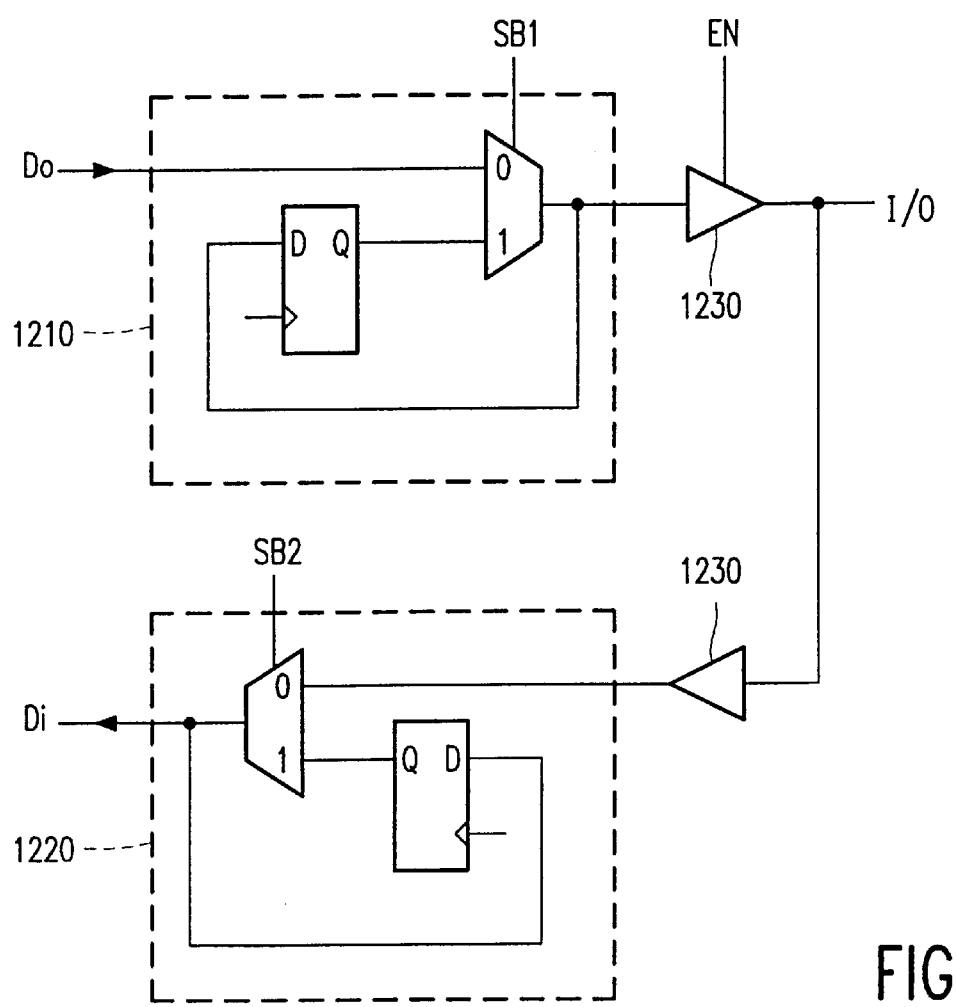
FIG. 12 illustrates example seam circuits for I/O interface signals in accordance with this invention.

FIG. 12 shows how the invention can be applied to I/O interface signal paths. An I/O interface signal path comprises two strings of flip-flops, one string for each direction. The interconnect is shared. The circuit of FIG. 12 shows one end of the I/O interface signal path, at which two seam circuits 1210 and 1220 are inserted. With seam circuit 1210 outgoing signals on the I/O line can be controlled, whereas with seam circuit 1220 incoming signals can be observed. Buffers 1230 provide signal amplification in both directions.

Figure 13:
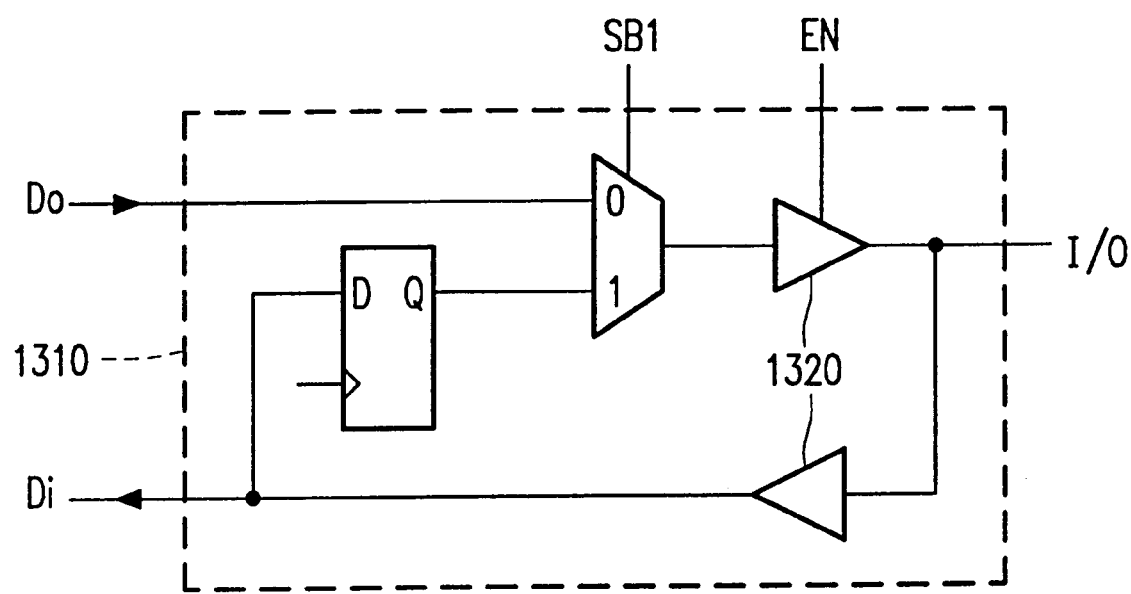
FIG. 13 illustrates an example alternative seam circuit for controlling output signals and observing input signals in accordance with this invention.

FIG. 13 shows an alternative to the circuit of FIG. 12. It provides a more compact solution for I/O interface signal paths than the circuit of FIG. 12, as seam circuit 1310 is used for both controlling outgoing signals and observing incoming signals. Buffers 1320 are inserted in the feedback loop of seam circuit 1310.

What is claimed is:

1. Integrated circuit comprising a first and a second clock domain being respectively controlled by a first and a second clock signal, the first clock domain and the second clock domain being interconnected via a set of interface signal paths, each of which comprising a respective string of flip-flops, an initial flip-flop of the string being located in the first clock domain and a final flip-flop of the string being located in the second clock domain, the string being arranged for serially moving a data bit along its flip-flops from the first to the second clock domain under control of the first and the second clock signals, characterized in that each one of the interface signal paths includes a first seam circuit that is configured to facilitate testing of the integrated circuit, the first seam circuit comprising: a seam input; a seam output coupled to the final flip-flop; a feedback loop having a seam multiplexer and a seam flip-flop being part of the relevant string and being part of a scan test chain, the seam flip-flop feeding a first input of the multiplexer, a second input of the multiplexer representing the seam input, an output of the feedback loop representing the seam output; so that a first state of the multiplexer allows loading of a data bit into the feedback loop via the seam input, and a second state of the multiplexer freezes the data bit in the feedback loop.

2. Integrated circuit as claimed in claim 1, characterized in that the first seam flip-flop is under control of the first clock signal.

3. Integrated circuit as claimed in claim 2, characterized in that the interface signal path further comprises a second seam circuit being under control of the second clock signal and being located in the second clock domain.

4. Integrated circuit as claimed in claim 1 comprising at least one first type seam circuit, wherein the output of the feedback loop is constituted by the output of the seam multiplexer.

5. Integrated circuit as claimed in claim 1 comprising at least one second type seam circuit, wherein the output of the feedback loop is constituted by the output of the seam flipflop.

6. Integrated circuit as claimed in claim 1 comprising at least one second type seam circuit being located in the first clock domain, the seam flip-flop of that seam circuit being formed by the initial flip-flop of the relevant string.

7. Integrated circuit as claimed in claim 1 characterized in that the seam multiplexers are controlled by respective direction control signals having a first and a second value, corresponding to the first and the second state of the corresponding seam multiplexer, respectively, the direction control signals being generated by respective scannable direction control flip-flops.

* * * * *